(12) United States Patent
Fleck et al.

(10) Patent No.: US 6,839,231 B2
(45) Date of Patent: Jan. 4, 2005

(54) HEAT DISSIPATION FROM A HAND-HELD PORTABLE COMPUTER

(75) Inventors: Rod G. Fleck, Bellevue, WA (US); Livius D. Chebeleu, San Jose, CA (US)

(73) Assignee: Vulcan Portals Inc., Seattle, WA (US)

( * ) Notice: Subject to any disclaimer, the term of this patent is extended or adjusted under 35 U.S.C. 154(b) by 0 days.

(21) Appl. No.: 10/338,761

(22) Filed: Jan. 7, 2003

(65) Prior Publication Data

US 2004/0130869 A1 Jul. 8, 2004

(51) Int. Cl.$^7$ ................................................. H05K 7/20
(52) U.S. Cl. .................. 361/687; 361/695; 165/104.33; 257/719
(58) Field of Search ................................ 361/685–687, 361/700, 704, 709, 760, 695, 699; 165/122, 126, 104.32, 104.33, 121; 364/708.1; 257/718–719; 62/259.2; 174/15.2

(56) References Cited

U.S. PATENT DOCUMENTS

| | | | | |
|---|---|---|---|---|
| 5,910,883 A | * | 6/1999 | Cipolla et al. ............... | 361/687 |
| 5,995,367 A | | 11/1999 | Smith et al. ................. | 361/695 |
| 6,038,128 A | * | 3/2000 | Hood et al. ................... | 361/687 |
| 6,138,748 A | | 10/2000 | Hamburgen et al. ........ | 165/185 |
| 6,266,241 B1 | * | 7/2001 | Van Brocklin et al. ..... | 361/687 |
| 6,276,448 B1 | | 8/2001 | Maruno ........................ | 165/185 |
| 6,525,934 B1 | * | 2/2003 | Nakanishi et al. ........... | 361/687 |
| 6,604,575 B1 | | 8/2003 | Degtiarenko ................. | 165/185 |
| 6,646,874 B2 | | 11/2003 | Pokharna et al. ............ | 361/687 |
| 6,687,123 B2 | | 2/2004 | Kitahara ...................... | 361/695 |

OTHER PUBLICATIONS

URL:http://www.sonystyle.com/is–bin/INTERSHOP.enfinity/eCS/Store/en/–/USD/SY$_{13}$ Display Pr . . . , "SonyStyle USA—R505G Series: Specifications," Download Date of Jan. 7, 2003.

URL:http://www.sonystyle.com/is–bin/INTERSHOP.enfinity/eCS/Store/en/–/USD/SY$_{13}$ DisplayPr . . . , "SonyStyle USA—R505G Series: Overview," Download Date of Jan. 7, 2003.

URL:http://www.sonystyle.com/intershoproot/eCS/Store/en/imagesProducts/ProductTour/comput . . . , "Sony VAIO R505G Superslim Pro Notebook," Download Date of Jan. 7, 2003.

URL:http://www.sonystyle.com/is–bin/INTERSHOP.enfinity/eCS/Store/en/–/USD/SY$_{13}$ DisplayPR . . . , "SonyStyle USA—PCGA–DSM51: Specifications," Download Date of Jan. 7, 2003.

URL:http://www.sonystyle.com/is–bin/INTERSHOP.enfinity/eCS/Store/en/–/USD/SY$_{13}$ DisplayPr . . . , "SonyStyle USA—PCGA–DSM51: Overview," Download Date of Jan. 7, 2003.

Product Description: "SONY.VAIO Computer Specifications PCG–R505GL, Hardware Specifications".

Product Description: "SONY.VAIO Computer Specifications PCG–R505GLK".

Product Description: "SONY.VAIO Computer Specifications PCG–R505 Series".

\* cited by examiner

*Primary Examiner*—Hung Van Duong
(74) *Attorney, Agent, or Firm*—Seed IP Law Group PLLC

(57) ABSTRACT

Heat is removed from a small hand-held portable computer by dissipating the heat from surfaces that are not typically held by the user during hand-held operation. The heat is dissipated from fins located at a rear underside casing of the portable computer. Heat-generating internal electronic components or their heat sinks are placed in close proximity to the fins. Heat may also be dissipated from the backside of the display screen. The dissipation of the heat allows the portable computer to operate at higher frequencies.

46 Claims, 4 Drawing Sheets

HEAT DISSIPATION FROM A HAND-HELD PORTABLE COMPUTER

BACKGROUND OF THE INVENTION

1. Field of the Invention

The present disclosure relates generally to heat transfer and heat dissipation techniques, and in particular but not exclusively, relates to removal of heat generated from a hand-held device, such as a portable computer, by transferring and dissipating the heat from non-hand-held regions of the device.

2. Description of the Related Art

Many laptops or other hand-held devices create 10–30 watts of power from processors, graphics systems, disk drives, memory systems, display drivers, backlights, and other components. This generated power is in the form of heat that must be moved away from the heat-generating chip(s) to the outside of the device. Failure to properly dissipate the heat can lead to device failure, permanent damage to the device, and potential fire or burn injury to a user.

Modern laptops use heat-pipes, heat sinks, and fan(s) to pull the heat to the outside surface or air. Newer smaller personal computers (PCs), such as sub-notebooks and ultra-portable computers, have three primary issues that influence their design and operation. First, as compared to conventional-sized PCs, it is more difficult to build extremely small devices while still leaving sufficient room for airflow. Second, it is difficult and undesirable to have a fan running in the device, due to size, weight, power, and noise issues. Third, these smaller devices have a significantly smaller surface area (in many cases less than ¼ of the area of a conventional-sized PC) to dissipate heat, which results in far higher temperatures on surfaces, thereby potentially causing burning (of the user's skin, for instance) or external fire.

Many of these newer and smaller devices are taking advantage of newer integrated chip (IC) technology that allows less power dissipation per task. Smaller device geometries on IC require lower voltages that allow lower heat generation. They can also allow higher performance, but a trade-off must be made between using the available additional performance against the heat that would be generated. Therefore, many solutions have opted for lower performance and lower voltage operation to solve these heat dissipation issues. This is unfortunate for users because such devices are losing the opportunity to provide higher performance.

BRIEF SUMMARY OF THE INVENTION

One aspect of the invention provides an apparatus that includes a casing having first and second areas. The first area is a region where the casing is hand-held during operation. The apparatus includes at least one internal component located inside of the casing and that is a source of heat. A heat dissipative element is thermally coupled to the internal component to dissipate the heat from the internal component, with the heat dissipative element being located proximate to the second area and being distanced from the first area.

BRIEF DESCRIPTION OF THE SEVERAL VIEWS OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Figure 1:
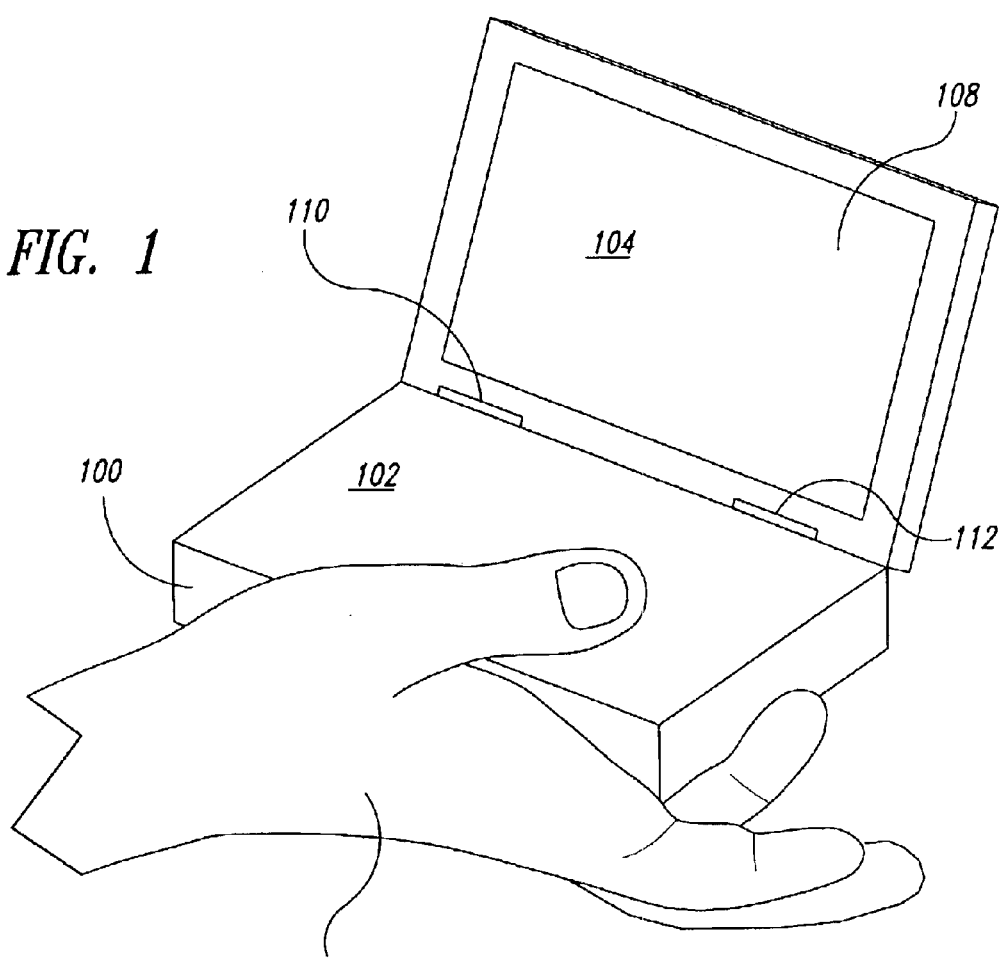
FIG. 1 shows a portable hand-held computer in accordance with an embodiment of the invention.

Embodiments of techniques to remove or reduce heat from a hand-held device, such as a portable computer, via dissipation of the heat from non-hand-held areas, regions, or zones of the portable computer are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, an embodiment of the invention provides a hand-held portable device (such as a portable computer having a small form factor) that dissipates heat from regions of the device that are not commonly used to hold the device. That is, the heat is pulled from the primary heat-producing chips (or other internal electronic components) to these regions, where the heat is dissipated to open air. In one embodiment, the housing (or casing) of the device itself can create a greater thermal heat-dissipating surface, such as via fin-like structures that provide increased surface areas.

Unlike laptops, which mainly rest on tables or laps (assuming clothing underneath), ultra-portable devices (such as the portable computer of an embodiment of the invention) are often used while being held in one or both hands. Current processors used for typical office applications will generate heat on surfaces that can exceed 60° C., which can cause burning. One embodiment of the invention provides the following features to reduce this. First, by building the casing such that the fins are exposed on portions of the device that are normally not held (such as the back of the device), a larger surface area to dissipate heat is created. These fins may be limited to the number required for thermal reduction by weight and available surface area constraints. The outer material of the casing is also heat-conductive (versus plastic, for instance, which insulates). Second, one or more internal heat sinks is thermally coupled to the exposed fins, but the heat sink(s) are not coupled to any other surfaces where heat is undesirable. Both heat sinking materials (like copper) or heat pipes can be used. Coupling can be done with thermal tapes, gels, or other suitable materials between chips, heat sinks, and target surfaces. Third, the processor frequency may be dropped to levels that accommodate lower voltage operation, if appropriate.

Other arrangements are provided by embodiments of the invention for efficient heat dissipation performance, which may be used in addition or alternative to the fins. For example, primary heat-generating internal electronic components can be placed near the heat-dissipative surfaces. This allows smaller and/or fewer heat sinks to be used, thereby contributing to the lightweight and compact nature of the portable device, since the thermal-transfer distance from the heat-generating components to the heat-dissipative surfaces is shorter.

As another example, an embodiment dissipates heat through the backside surface of a display screen of the portable device. In this embodiment, heat transfer is performed through the hinge (or other connector) of the portable device, such as via use of a higher heat-conductive material with a pin-in-sleeve configuration and a heat spreader on the backside surface of the display screen.

As yet another example, a board design is provided in an embodiment, which places at least some of the heat-generating internal electronic components on a single surface with a common heat sink, thereby also reducing weight and size of the portable device. All of these example heat dissipation techniques, whether singly or in combination, allows the portable device to have higher performance while meeting thermal limits for operation. For example, the frequency of operation while in hand-held operation can be increased, due to the increased thermal cooling capability, thereby increasing performance.

FIG. 1 shows a portable hand-held computer 100 in accordance with an embodiment of the invention. While the portable computer 100 is used as the illustrative example throughout this application, it is appreciated that other embodiments of the invention may be implemented with devices that may not necessarily be thought of as a "computer" by the average individual. Examples include wireless communication devices, display devices, monitors, audio-video equipment, consumer electronic devices, or other electronic device that can have a reduced form factor and which can potentially have heat dissipation problems that are addressable by the heat removal techniques described herein.

As shown, the portable computer 100 is similar in appearance to a laptop, in that it comprises first and second portions 102 and 104, respectively. The first portion 102 can include a keyboard and housing for the internal electronic components (such as a processor, disk drives, graphics drivers, and so forth). The second portion 104 folds over the first portion 102 (when in a closed position), and includes a display screen 108 for displaying information while the second portion 104 is unfolded to an upright position (as shown in FIG. 1).

To provide this folding/unfolding capability, plus other operational capabilities, a plurality of hinges couple the first portion 102 to the second portion 104. For example, a first hinge 110 provides structural rigidity and pivotal rotation for the second portion 104, thereby allowing the second portion 104 to move between folded and unfolded positions (and positions in-between) and to remain stationary at a particular position. A second hinge 112 also provides some structural rigidity and pivotal rotation capability, but also serves as a conduit for electrical connections between the first portion 102 and the second portion 104. There may be additional hinges (not shown) in some embodiments of the portable computer 100.

Unlike a conventional laptop, however, the portable computer 100 is substantially smaller in size in terms of both volume and weight. An example dimensional size of the portable computer 100 is 140 mm long, 100 mm wide, and 30 mm thick (while closed), with a weight of approximately one pound. The display screen 108 on the second portion 104 is of a resolution comparable to a desktop computer monitor. In general, the size of the display screen 108, the size of the internal components (e.g., chips and circuit boards) located within the first portion 102, and the strategic placement of the internal components (e.g., density), and other factors will influence the overall form factor of the portable computer 100. As illustrated in FIG. 1, the portable computer 100 has a size such that it can be held securely in a hand 106 of a user.

Figure 2:
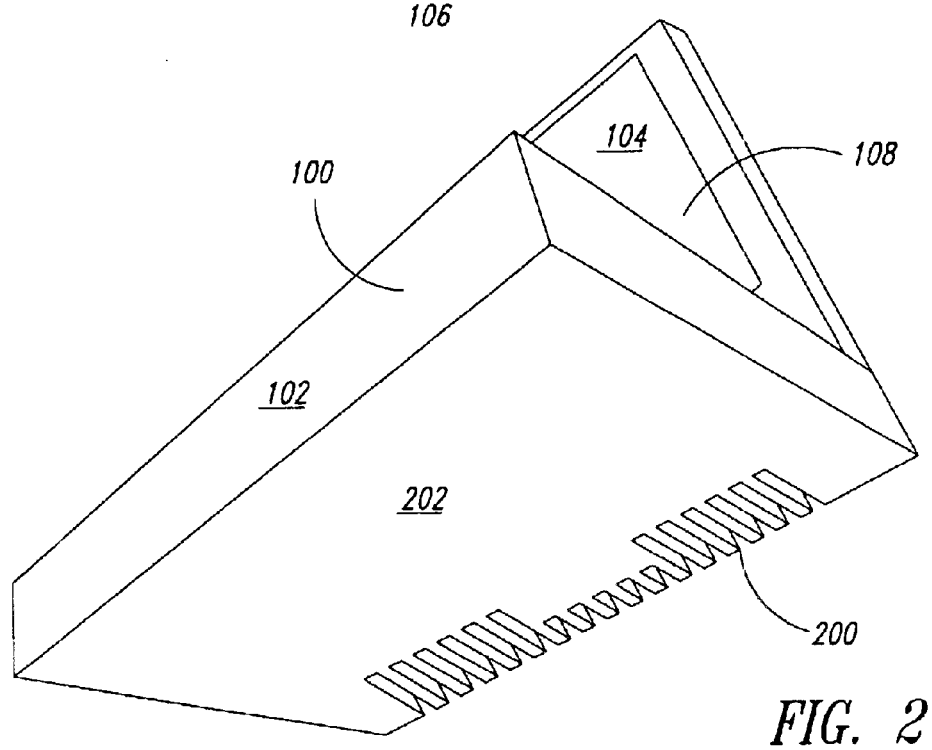
FIG. 2 shows fins located at an underside surface of the portable computer of FIG. 1 in accordance with an embodiment of the invention.

FIG. 2 shows a set of fins 200 located at an underside surface 202 of the portable computer 100 of FIG. 1 in accordance with an embodiment of the invention. The fins 200 are located at the rear (back) end of the portable computer 100, in a location or region that is generally where the user's hand(s) 106 does not hold the portable computer 100. This location for the fins 200 is selected because heat can be dissipated from this location and can be sufficiently distant from the user's hand(s) 106 during hand-held operation, thereby minimizing discomfort or potential burn injury.

Example techniques to dissipate heat from a portable computer, while in docking station and via use of the docking station, are disclosed in co-pending U.S. application Ser. No. 10/338802, entitled "SYSTEM AND METHOD FOR HEAT REMOVAL FROM A HAND-HELD PORTABLE COMPUTER WHILE DOCKED," filed concurrently herewith, assigned to the same assignee as the present application, and which is incorporated herein by reference in its entirety. This co-pending application discloses example techniques to dissipate heat from a docked portable computer, using the docking station as a type of "air conditioner" for the portable computer. For brevity, details of these heat dissipation techniques will not be provided herein, since the present application is focused on heat removal from the portable computer during hand-held operation, rather than while it is docked. The reader is nevertheless invited to review the co-pending application for information that may be of interest.

The fins 200 operate to increase the available surface areas for heat dissipation. Based on arrangements that will be described in further detail below, the heat is generated by the internal electronic components of the portable computer 100, captured by one or more heat sinks or heat pipes, and then carried to the fins 200 for dissipation therefrom. In an embodiment, the fins 200 are integrated or otherwise formed with the housing for the portable computer 100, and comprise a heat-conductive (and heat-dissipative) material. An example material suitable for the fins 200 is a magnesium alloy, copper, or other suitable heat-conductive and heat-dissipative material. The fins 200 may be of any suitable size, shape, number, spacing, or other configuration or arrangement that provides the desired thermal performance, while still being able to be accommodated by the physically smaller size of the portable computer 100. The fins 200 or other heat-dissipative structure(s) may be triangular, rectangular, arcuate, spherical, or other suitable structures that provides the requisite thermal performance by increasing surface area.

Use of the fins 200 and/or other heat dissipation techniques described herein allows the portable computer 100 to exclude use of an internal fan for heat dissipation (e.g., it is a "fan-less device"). The fan-less feature allows the portable computer 100 to be smaller, lighter, and quieter. For added control over heat generation and dissipation, an embodiment reduces the processor frequency to levels that can accommodate lower voltage operation, and thereby lesser heat generation.

Figure 3:
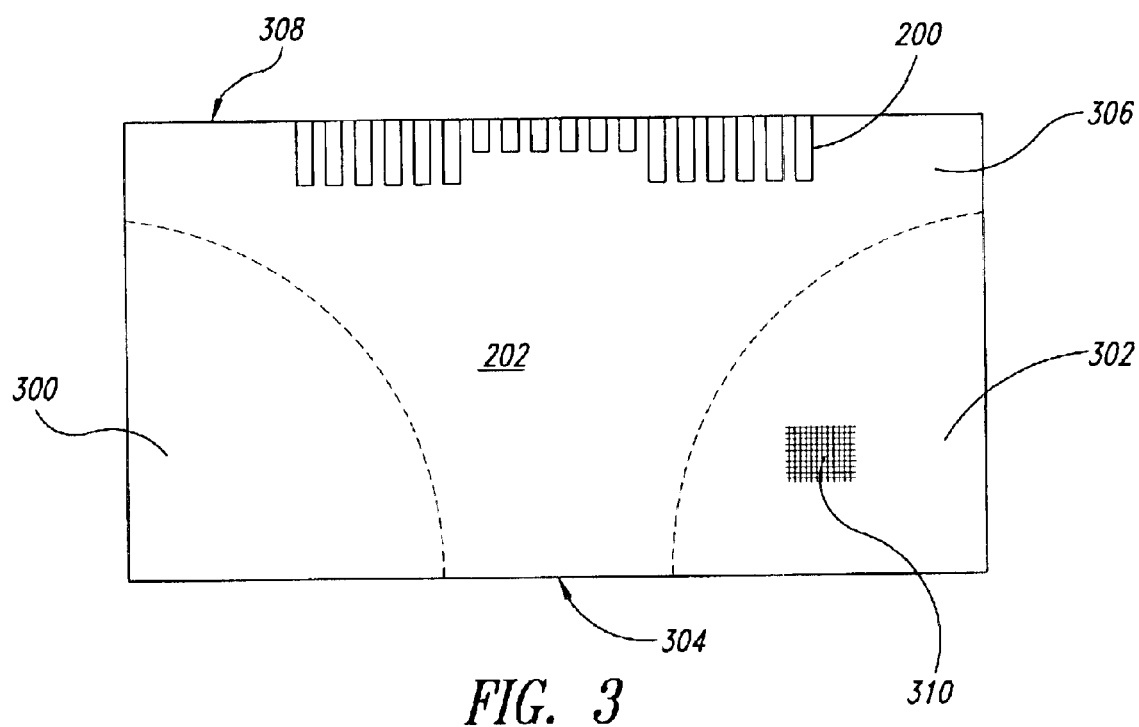
FIG. 3 further illustrates placement of the fins at non-hand-held areas on the underside surface of the portable computer in accordance with an embodiment of the invention.

FIG. 3 further illustrates placement of the fins 200 at non-hand-held areas on the underside surface 202 of the portable computer 100 in accordance with an embodiment of the invention. Areas 300 and 302 depict regions (approximately indicated by broken lines) on the underside surface 202 where a user typically places his right and left hands, respectively, while holding and operating the portable computer 100. Because of the size of the portable computer 100, for proper support, and for proper dexterity when using the keypad on the other side, the hand-held areas 300 and 302 are generally located towards a front end 304 of the portable computer 100 and at its sides.

In contrast, the fins 200 are located in a non-hand-held area 306. In the illustrated embodiment, the non-hand-held area 306 is located towards a rear end 308 (e.g., the hinge end) of the portable computer 100. The area 306 having the fins 200 is sufficiently distanced from the areas 300 and 302, such that the heat radiated from the fins 200 does not bother the hands of the user at the areas 300 and 302. Heat may be dissipated from the fins 200 and/or from the areas 306 of the casing itself.

In one embodiment, an insulation 310 (a portion of which is shown in FIG. 3) may be present at the hand-held areas 300 and 302, so as to insulate the user's hand(s) 106 from heat that may transfer to these areas. For example, the insulation 310 may be in the form of insulative paint, which is applied over the areas 300 and 302 but not applied at the area 306 or at the fins 200. In another example embodiment, the casing at the hand-held areas 300 and 302 may be made from a plastic material (which insulates), while the casing at the non-hand-held area 306 and/or the fins 200 may be made of a heat conductive (and heat dissipative) material, such as a magnesium or copper alloy or other suitable material. Internal electronic components that are adversely affected by heat, such as batteries, may also be insulated from heat. In yet another example embodiment, an insulating material may be placed on the end of the fins 200 to protect against burning at the edges. This allows the blades of the fins 200 to dissipate heat, but the edges to stay below this temperature.

Figure 4:
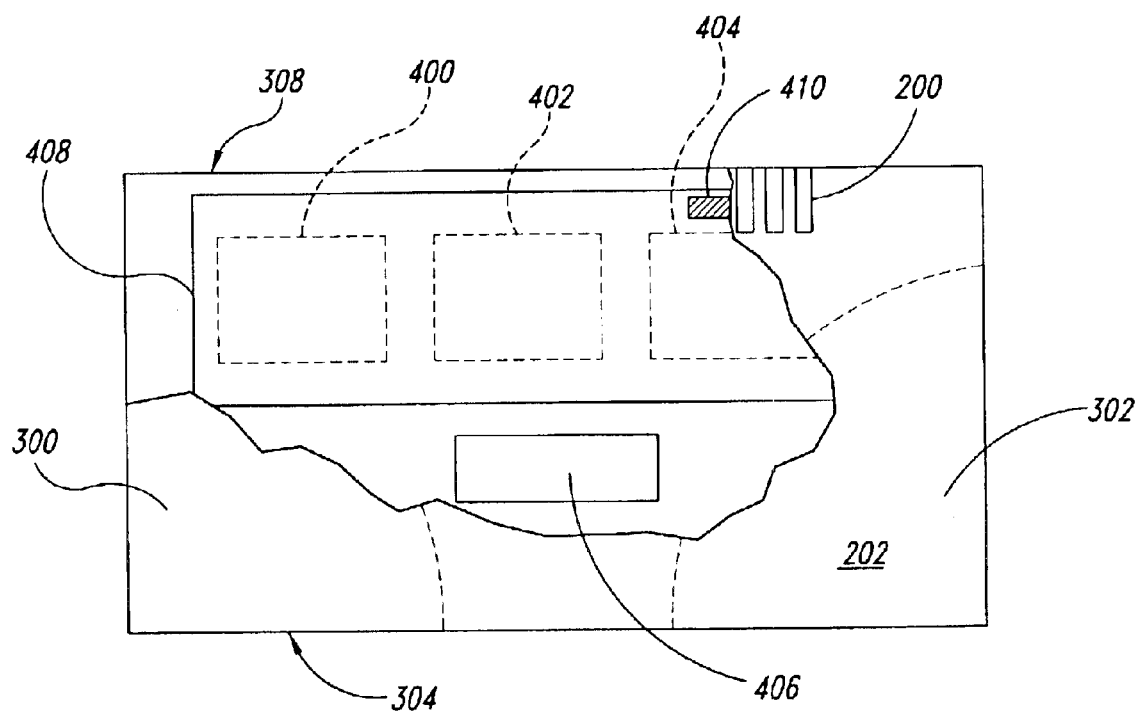
FIG. 4 is a partial cut-away view from the underside surface of the portable computer, and illustrates an example placement of heat-generating components and a heat sink in accordance with an embodiment of the invention.

FIG. 4 is a partial cut-away view from the underside surface 202 of the portable computer 100, and illustrates an example placement of heat-generating components and a heat sink in accordance with an embodiment of the invention. Heat-generating components 400, 402, and 404 can comprise, respectively, a driver for light tubes, a processor, and a disk drive mechanism. Other possible heat-generating components can include, but not be limited to, a graphics driver, radio, ball grid array (BGA) components, and others. The various heat-generating components can comprise chips, chip sets, discrete elements, circuit board assemblies, or any combination of electronic components that are known to generate heat that needs to be removed.

In the illustrated embodiment, the components 400–404 that are known to generate the most heat are located towards the rear end 308 of the portable device 100, and away from the front end 304 and other regions adjacent to hand-held areas 300 and 302. The highest heat-generating components are placed as close to the fins 200 as possible, taking into consideration wiring and routing on the primary circuit board, where some configuration issues can occur due to high-pin-count packages. One or more components 406 that generate minimal heat (or that cannot otherwise be positioned towards the rear end 308) may be located nearer to the hand-held areas 300 and 302.

In an embodiment, the heat-generating components 400–404 share a common heat sink 408 on the same circuit board. Such a design may be used, for instance, with systems that include ball grid array (BGA) components. Because a plurality of heat-generating components 400–404 are concentrated in a relatively small region of the portable device 100, the single heat sink 408 may be used to draw heat from all of these components. Use of the single heat sink 408 further adds to the compactness and lightweight feature of the portable computer 100. Moreover, because the heat sink 408 is also located towards the rear end 308, a smaller-size heat sink may be used (thereby further adding to the compact and lightweight nature of the portable computer 100) since there is a shorter distance for heat transfer from the heat sink 408 to the fins 200.

The heat sink 408 may be made of a suitable heat-conductive material, such as copper or other material typically used for heat sinks. The shape, thickness, dimensions, and other physical characteristics of the heat sink 408 will not be described in further detail herein, since such details would be familiar to those skilled in the art having the benefit of this disclosure.

While FIG. 4 illustrates an embodiment where the heat-generating components 400–404 are strategically located at the rear end 308 adjacent to the fins 200, it is appreciated that one or more heat-generating components need not necessarily be located at this region in other embodiments. For example in one embodiment, a heat-generating component may be located at or nearer to one of the hand-held areas 300 or 302—however, such a component may be thermally coupled to the heat sink 408 (located at the non-hand-held area 306). The heat sink 408 is thus able to draw heat away from such a component, so as to maintain comfortable temperatures for the user's hands at the areas 300 or 302. Accordingly in embodiments of the invention, at least one type of element that is a source of heat (whether such an element is the heat sink 408 or other element that draws heat, or whether such an element is the actual component that generates the heat) is placed in a non-hand-held area of the portable computer 100.

Still referring to FIG. 4, a thermal coupling medium 410 couples the heat sink 408 to the fins 200. The thermal coupling medium 410 can comprise any suitable heat-conductive material through which heat may transfer from the heat sink 408 to the fins 200 (or to some other heat-dissipating surface). Examples of the thermal coupling medium 410 include thermal tapes, thermal gels, or other suitable material that would be familiar to those skilled in the art having the benefit of this disclosure. The thermal coupling medium 410 may be used to thermally couple not only the heat sink 408 to the fins 200, but may also be used to thermally couple the heat-generating components 400–404 to the heat sink 408 if appropriate.

The thermal coupling medium 410 is selectively applied so as to thermally couple the heat sink 408 to the appropriate target surface(s). Where appropriate, insulation or other techniques are used to ensure that the heat sink 408 is not coupled to surfaces that are not designed for heat dissipation (such as the hand-held areas 300 and 302, or components sensitive to heat, such as batteries).

Figure 5:
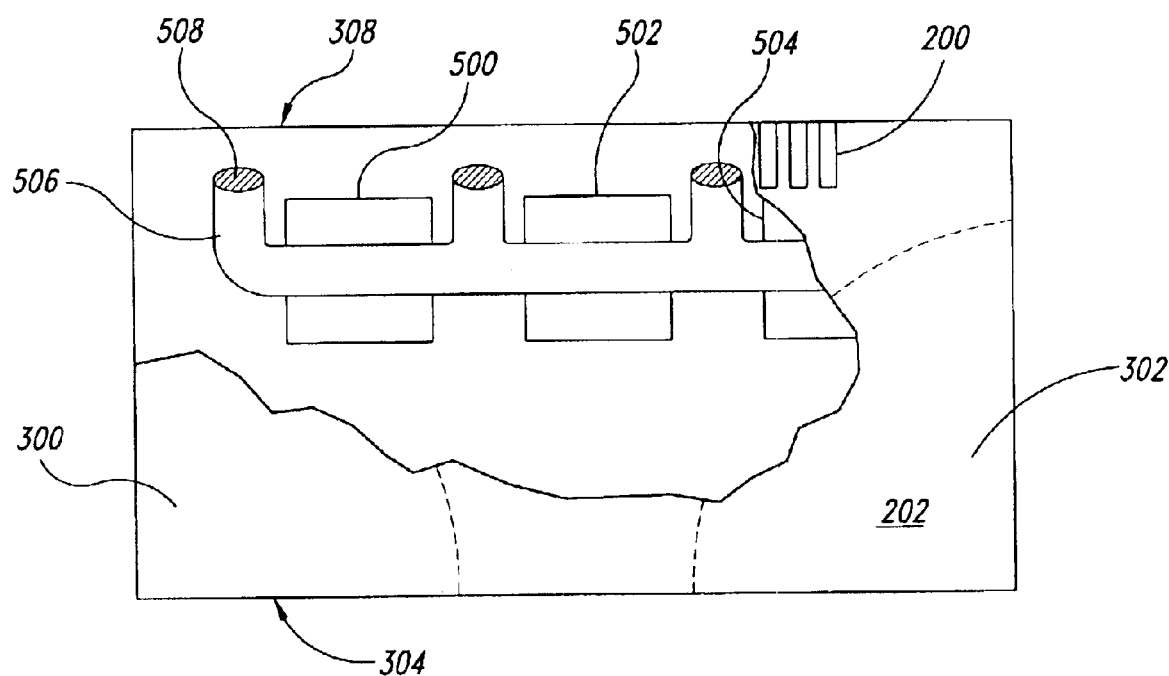
FIG. 5 is another partial cut-away view from the underside surface of the portable computer, and illustrates an example placement of heat-generating components and heat pipes in accordance with an embodiment of the invention.

FIG. 5 is another partial cut-away view from the underside surface 100 of the portable computer 100, and illustrates an example placement of heat-generating components and heat pipes in accordance with an embodiment of the invention. It is appreciated that the coupling between the heat pipe and the heat-generating components depicted in FIG. 5 is intended to be illustrative and symbolic, rather than being technically precise. A person skilled in the art having the benefit of this disclosure would know how to thermally couple heat-generating components to a heat pipe.

As with FIG. 4, heat-generating components 500, 502, and 504 in FIG. 5 are located towards the rear end 308 of the portable computer 100, adjacent to the fins 200 and away from the hand-held areas 300 and 302. A heat pipe 506 is thermally coupled to the heat-generating components 500–504 to remove the heat therefrom. As is known, a heat pipe is a type of device that holds a fluid that absorbs heat, thereby drawing heat from and cooling the components to which it is coupled. Heat pipes that use liquids have the advantage in that they can move more heat per gram of weight. However, they tend to be thicker or otherwise larger in size than other heat-transfer components. A type of flat and solid (e.g., does not use fluid) can be used in an embodiment, where space constraints do not allow use of liquid-filled heat pipes.

The heat pipe 506 is thermally coupled to the fins 200 (or to some other heat-dissipative surface) via a thermal coupling medium 508 symbolically illustrated in FIG. 5. The thermal coupling medium 508 may be similar to the thermal coupling medium 410 of FIG. 4. Moreover and as previously described above for another embodiment, at least some of the heat-generating components 500–504 may be located closer to the hand-held areas 300, so long as the heat pipe 506 is located near the fins 200 and can effectively draw heat away from such heat-generating component(s).

Figure 6:
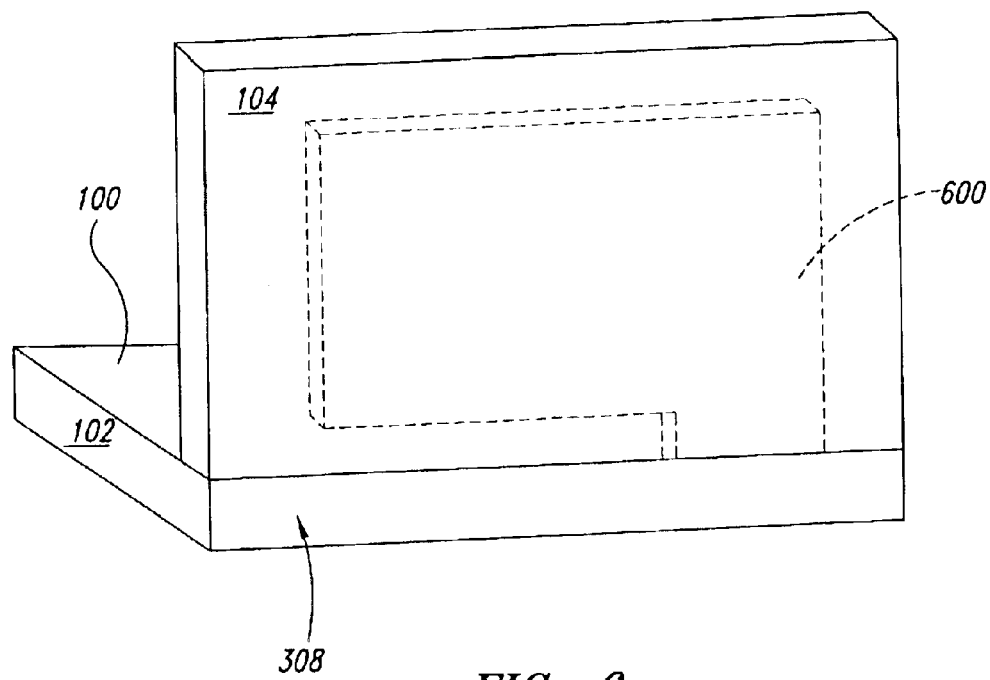
FIG. 6 is a view from a rear end of the portable computer of FIG. 1, illustrating heat dissipation from a backside of a display screen in accordance with an embodiment of the invention.

FIG. 6 is a view from the rear end 308 of the portable computer 100, illustrating heat dissipation from a backside of the display screen 108 in accordance with an embodiment of the invention. The backside casing of the display screen 108 is a region or area that is normally not held or touched by the hands 106 of the user during hand-held operation. Therefore, it is a good surface from which to dissipate heat.

In accordance with an embodiment of the invention, a heat sink 600 (or other heat conductive and heat dissipative element) is placed in the second portion 104 of the portable computer 100, behind the display screen 108. The heat sink 600 can have a plate shape, grill arrangement, or other suitable heat-spreader configuration. In one embodiment, the top outer casing for the second portion 100 (behind the display screen 108) can be made from a heat-conductive (and heat-dissipative) material, and the heat sink 600 is thermally coupled to this material, thereby allowing heat transfer from the heat sink 600 to the outer casing for resultant heat dissipation to open air.

Figure 7:
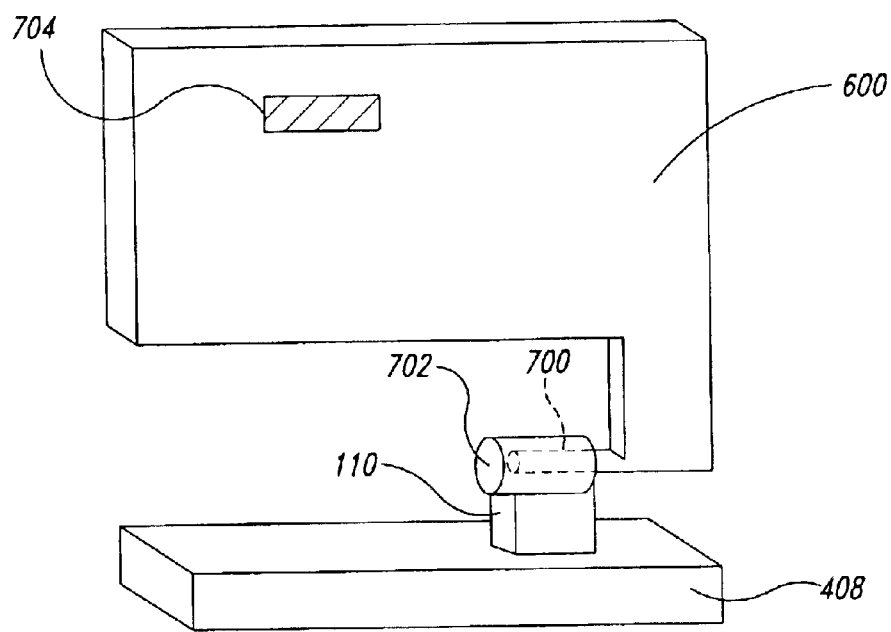
FIG. 7 illustrates a hinge assembly used in connection with the heat dissipation from the backside of the display screen of FIG. 6 in accordance with an embodiment of the invention.

FIG. 7 illustrates a hinge assembly (or other connector) used in connection with the heat dissipation from the backside of the display screen of FIG. 6 in accordance with an embodiment of the invention. It is appreciated that the illustrated hinge assembly is merely illustrative of one technique to provide heat transfer and mechanical support, and that other types of thermal coupling elements may be used. In the illustrated example, the thermal coupling is performed via the first hinge 110 that provides mechanical support (as opposed to the second hinge 112, which provides electronic signal routing). In other embodiments, the thermal coupling may be performed via a third hinge, different from the first and second hinges 110 and 112, respectively.

In FIG. 7, the hinge 110 comprises a pin-in-sleeve assembly. A sleeve portion 702 is thermally coupled to the heat sink 408 (or other source of heat) in the first portion 102 of the portable computer 100. The sleeve portion 702 has an internal shaft that holds a pin portion 700 that is coupled to the heat sink 600. The pin-in-sleeve assembly allows the heat sink 600 to rotate as the second portion 104 is folded and unfolded, and also provides the requisite mechanical support. Moreover, physical contact between the sleeve portion 702 and the pin portion 700 ensures proper heat transfer to the heat sink 600.

In one embodiment of the invention, the heat sink 600 is made of a higher heat-conductive material than the heat sink 408. This difference in heat conductivity ensures that the heat travels from the heat sink 408 to the heat sink 600.

A thermal coupling medium 704 (similar to the thermal coupling media 410 and 508) couples the heat sink 600 to the heat dissipating surface(s), such as the outer casing for the second portion 104. The thermal coupling medium 704 or other heat conductive material may also be used to thermally couple the display screen 108 (or other heat-generating component present in the second portion 104) to the heat sink 600. It is also appreciated that in an embodiment, the heat sink 600 can comprise the outer casing of the second portion 104 itself, made from a heat-conducting and heat-dissipative material that is thermally coupled via the hinge 110 to the heat sink 408 (or to other sources of heat).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

For example, while the fins 200 have been illustrated and described herein as being located on the underside surface 202 and towards the back end 308 of the portable computer, it is appreciated that these or other fins may be located in other surface regions of the portable computer 100. Fins may be present on the top surface of the second portion 104 (e.g., on the display screen casing/cover) to dissipate heat transferred by heat sinks coupled to these fins. Such fins may be arranged in a decorative pattern-like manner on the top surface to provide an aesthetic appearance, in addition to heat-dissipative features.

As another example, a brick or tablet shape (or other shape) for a portable electronic device may embody the heat-dissipation techniques described herein. Thus, the invention is not necessarily restricted to a laptop shape for the portable device.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
   a casing having first and second areas, the first area being a region where the casing is hand-held during operation;
   at least one internal component located inside of the casing and that is a source of heat; and
   a first heat dissipative element thermally coupled to the internal component to dissipate the heat from the internal component, the heat dissipative element being located proximate to the second area and being distanced from the first area, wherein the heat dissipative element includes a plurality of fins located at a rear end of the casing.

2. The apparatus of claim 1 wherein the second area includes a portion of the casing on a backside of a display screen.

3. The apparatus of claim 1 wherein the internal component comprises an electronic component that is located proximate to the second area.

4. The apparatus of claim 1 wherein the internal component comprises a heat-conductive element that is located proximate to the second area and is distanced from the first area.

5. The apparatus of claim 1, further comprising a thermal coupling medium to thermally couple the heat dissipative element to the internal component.

6. The apparatus of claim 1, further comprising an insulative material to insulate the first area from the heat.

7. The apparatus of claim 1 wherein the plurality of fins can dissipate heat absent a fan in the casing.

8. The apparatus of claim 1 wherein a plurality of internal components that are sources of heat is placed in close proximity to the plurality of fins.

9. The apparatus of claim 2, further comprising:
   a first portion having the internal component;
   a second portion having a second heat dissipative element and having the portion of the casing on the backside of the display screen; and
   a connector to mechanically couple the first and second portions, and to thermally couple the internal component in the first portion to the second heat dissipative element in the second portion.

10. The apparatus of claim 2 wherein the second heat dissipative element further includes a heat spreader located at least partially behind the display screen and thermally coupled to the casing on the backside of the display screen.

11. The apparatus of claim 2 wherein the second heat dissipative element includes the portion of the casing on the backside of the display screen.

12. The apparatus of claim 4 wherein the heat-conductive element comprises at least one of a heat sink and heat pipe.

13. The apparatus of claim 4 wherein the heat-conductive element is common to a plurality of internal components that is the source of the heat.

14. The apparatus of claim 13 wherein the heat-conductive element includes a heat sink having a common surface on which at least some of the plurality of internal components is placed.

15. An apparatus, comprising;
   a hand-held portable computer having a first portion coupled to a second portion, the second portion including a display screen;
   a housing for the portable computer to house a plurality of internal components, the housing including a first area that is hand-held during operation of the portable computer and including a second area; and
   a first heat dissipative element to dissipate heat from the plurality of internal components, the heat dissipative element being located at the second area and being distanced from the first area, wherein the heat dissipative element includes a plurality of fins on the housing located at a rear end of the portable computer, and wherein the plurality of internal components include a plurality of electronic components that share a common heat sink and that are located adjacent to the rear end of the portable computer.

16. The apparatus of claim 15 wherein at least some of the second area is located at the second portion, in a region comprising a portion of the housing at a backside of the display screen.

17. The apparatus of claim 15 wherein the first heat dissipative element further includes a surface region of the second area of the housing, the surface region being located in the second portion that includes the display screen and being thermally coupled to the internal components.

18. The apparatus of claim 16, further comprising a thermal coupling element to thermally couple internal components in the first portion that generate heat to a second heat dissipative element in the second portion.

19. The apparatus of claim 18 wherein the thermal coupling element comprises a hinge having a pin-in-sleeve configuration.

20. The apparatus of claim 18 wherein the second heat dissipative element has a higher heat-conductivity relative to one of the internal components from which it receives heat.

21. The apparatus of claim 19 wherein the hinge having the pin-in-sleeve configuration further provides mechanical support for the second portion in addition to thermal coupling.

22. A method, comprising:
   generating heat during operation of a hand-held device, the hand-held device having a first region and a second region;
   transferring the generated heat to a heat-conductive material located adjacent to the first region of the hand-held device, the second region being a hand-held region of the hand-held device; and
   dissipating the transferred heat from the first region, wherein transferring the generated heat to the heat-conductive material located adjacent to the first region of the hand-held device includes transferring the generated heat to a plurality of rear-side heat-dissipative structures formed in a housing of the hand-held device, the plurality of rear-side heat-dissipative structures including rear-side fins.

23. The method of claim 22 wherein transferring the generated heat to the heat-conductive material located adjacent to the first region of the hand-held device further includes transferring the generated heat to the heat-conductive material located at a backside area of a display screen of the handheld device.

24. The method of claim 22 wherein transferring the generated heat to the heat-conductive material located adjacent to the first region of the hand-held device further includes transferring the generated heat from a plurality of electronic components that generate the heat and that are coupled to a common heat-conductive material.

25. The method of claim 22 wherein dissipating the transferred heat from the first region comprises dissipating the heat from a casing of the device that includes the rear-side fins.

26. The method of claim 22, further comprising increasing an operating frequency of the hand-held device.

27. The method of claim 23 wherein dissipating the transferred heat includes dissipating the transferred heat from a casing at the backside area that is thermally coupled to the heat-conductive material.

28. The method of claim 24 wherein the electronic components and the common heat-conductive element are both located adjacent to the first region.

29. The method of claim 26 wherein increasing the operating frequency of the hand-held device includes increasing the operating frequency of the hand-held device while the hand-held device is undocked.

30. The method of claim 26 wherein dissipating the transferred heat from the first region includes dissipating the transferred heat using fanless heat removal.

31. An apparatus, comprising:
a housing of a hand-held electronic device, the housing having first and second portions;
a plurality of internal components located within the first portion of the housing, the plurality of internal components capable of generating heat during operation of the electronic device;
a heat dissipative element located at the second portion of the housing; and
a solid-body hinge to mechanically couple the first portion of the housing to the second portion of the housing to provide structural support for the second portion of the housing, the solid-body hinge further thermally coupling the plurality of internal components to the heat dissipative element to allow heat generated by the plurality of internal components to be transferred to the heat dissipative element.

32. The apparatus of claim 31 wherein the heat dissipative element includes a heat spreader located within the second portion of the housing and being thermally coupled to the solid-body hinge.

33. The apparatus of claim 31 wherein the heat dissipative element includes an outer surface of the second portion of the housing to which the solid-body hinge is thermally coupled to allow the outer surface to directly dissipate the heat.

34. The apparatus of claim 31 wherein the solid-body hinge has a pin-in-sleeve structure.

35. An apparatus, comprising:
a casing having a small form factor, the casing including first and second areas, the first area being a region where the casing is hand-held during operation;
a plurality of internal components located inside of the casing, the plurality of internal components being sources of heat and further being concentrated in locations proximate to the second area based on the small form factor of the casing; and
a heat dissipative element thermally coupled to the plurality of internal components to dissipate heat from the plurality of internal components, the heat dissipative element being located proximate to the second area and being distanced from the first area, the heat dissipative element further being located in close proximity to the plurality of internal components to reduce a heat-transfer distance between the plurality of internal components and the heat dissipative element based on the small form factor of the casing.

36. The apparatus of claim 35 wherein the heat dissipative element includes a plurality of fins located at a plurality of rear-side regions of the second area.

37. The apparatus of claim 35 wherein the small form factor of the casing enables heat transfer between the plurality of internal components and the heat dissipative element substantially without use of a fluid-flow mechanism.

38. The apparatus of claim 35 wherein the small form factor of the casing enables at least some of the plurality of internal components to be positioned against a common surface of the heat dissipative element, which comprises a common surface of a heat sink.

39. The apparatus of claim 37 wherein the heat transfer substantially without fluid-flow mechanism includes heat transfer without use of an air fan inside of the casing.

40. The apparatus of claim 37 wherein the heat transfer substantially without use of the fluid-flow mechanism includes heat transfer without use of a heat pipe.

41. An apparatus, comprising:
a housing of a hand-held portable computer having internal components, the housing including a first area and a second area, the first area being hand-held during operation of the portable computer; and
a heat dissipative element to dissipate heat from the internal components, the heat dissipative element being located at the second area and being distanced from the first area to allow heat dissipation via surface-to-surface cooling from the internal components to the second area substantially without use of fluid circulation for heat dissipation within the housing.

42. The apparatus of claim 41 wherein the heat dissipative element comprises a plurality of fins formed on an outside rear surface of the housing at the second area.

43. The apparatus of claim 41 wherein the heat dissipation via surface-to-surface cooling substantially without use of fluid circulation for heat dissipation includes surface-to-surface cooling without use of fan that generates airflow to carry heat.

44. The apparatus of claim 41 wherein the heat dissipation via surface-to-surface cooling substantially without use of fluid circulation for heat dissipation includes surface-to-surface cooling without use of a heat pipe having liquid to carry heat.

45. The apparatus of claim 41 wherein the housing has a small form factor that enables the plurality of internal components to be concentrated at the second area adjacent to the heat dissipative element to maximize the surface-to-surface cooling from the plurality of internal components to a surface of the second area.

46. The apparatus of claim 42, further comprising a heat sink located proximate to the second area and having a common surface against which the internal components are placed, the heat sink further being thermally coupled to the plurality of fins to allow the surface-to-surface cooling substantially without use of fluid circulation for heat dissipation.

* * * * *

UNITED STATES PATENT AND TRADEMARK OFFICE
CERTIFICATE OF CORRECTION

PATENT NO. : 6,839,231 B2
DATED : January 4, 2005
INVENTOR(S) : Fleck et al.

It is certified that error appears in the above-identified patent and that said Letters Patent is hereby corrected as shown below:

Title page,
Item [56], References Cited, U.S. PATENT DOCUMENTS, the following should be included:
-- 5,313,362        05/17/94      Hatada et al................361/709
   6,414,844        07/02/02      Shimada et al..............361/687
   2002/0051339     05/02/02      Ohashi et al................361/687
   2002/0105781     08/08/02      Ohashi et al................361/687 --
FOREIGN PATENT DOCUMENTS, the following should be included:
-- 2001/125683     05/11/01     JP (+ Abstract in English) --

Column 12,
Line 24, "without fluid-flow mechanism" should read as -- without use of the fluid-flow mechanism --.

Signed and Sealed this

Twenty-fourth Day of May, 2005

JON W. DUDAS
*Director of the United States Patent and Trademark Office*